(12) United States Patent
Souda

(10) Patent No.: US 6,768,964 B2
(45) Date of Patent: Jul. 27, 2004

(54) METHOD AND APPARATUS FOR DETERMINING DOT-MARK-FORMING POSITION OF SEMICONDUCTOR WAFER

(75) Inventor: Akihiko Souda, Kanagawa-ken (JP)

(73) Assignee: Komatsu Limited, Tokyo (JP)

( * ) Notice: Subject to any disclaimer, the term of this patent is extended or adjusted under 35 U.S.C. 154(b) by 0 days.

(21) Appl. No.: 10/304,354

(22) Filed: Nov. 26, 2002

(65) Prior Publication Data

US 2003/0105610 A1 Jun. 5, 2003

(30) Foreign Application Priority Data

Dec. 5, 2001 (JP) ........................................ 2001-371572

(51) Int. Cl.⁷ .............................................. G06F 15/00
(52) U.S. Cl. ..................................................... 702/150
(58) Field of Search ................................ 702/150, 134, 702/159, 172, 40; 356/400, 401

(56) References Cited

U.S. PATENT DOCUMENTS 4,929,893 A * 5/1990 Sato et al. ................... 324/758
5,231,471 A * 7/1993 Torigoe ....................... 356/401
5,400,145 A * 3/1995 Suita et al. .................. 356/401
6,471,464 B1 * 10/2002 Fay et al. .................... 414/783

FOREIGN PATENT DOCUMENTS

| JP | 4-212436 | 8/1992 |
| JP | 6-045226 | 2/1994 |
| JP | 7-201688 | 8/1995 |
| JP | 2000-223382 | 8/2000 |
| JP | 2001-235309 | 8/2001 |
| JP | 2002-093692 | 3/2002 |

* cited by examiner

*Primary Examiner*—Michael Nghiem
(74) *Attorney, Agent, or Firm*—Bell, Boyd & Lloyd LLC

(57) ABSTRACT

Illumination light of an illumination device irradiates a part of a peripheral surface of a semiconductor wafer from a side of the semiconductor wafer. Then, a shape of a side surface of a rim of the wafer that is an area to be processed is picked up by a image-pickup device disposed in an irradiation direction so as to be opposed to the illumination device interposing the wafer. A difference of the shape of a contour of the wafer rim can be recognized visually/automatically, promptly and accurately, and a minute and local planar area to be processed on the wafer rim can be determined accurately.

2 Claims, 10 Drawing Sheets

METHOD AND APPARATUS FOR DETERMINING DOT-MARK-FORMING POSITION OF SEMICONDUCTOR WAFER

BACKGROUND OF THE INVENTION

1. Field of the Invention

The present invention relates to a prompt and accurate positioning method which can arbitrarily specify a forming position of dot marks for production management or various securities, which are made at a minute substantially planar portion existing on a peripheral surface of a semiconductor wafer and a positioning apparatus therefor. The forming position of dot marks according to the present invention means where dot marks must be formed and where dot marks are formed.

2. Prior Art

Conventionally, in the steps for manufacturing a semiconductor, for example, variable and strict manufacturing conditions must be set for the respective steps. In order to manage such manufacturing conditions, primary marks by numbers, characters or dots, or marks by a bar code or the like are indicated on a partial surface of a semiconductor wafer. However, the number of steps for manufacturing a semiconductor reaches several hundreds or more as high integration of a semiconductor proceeds. In addition, large numbers of element forming processes and planarizing processes are performed in the respective steps. As these processes, planarizing processes performed by, for example, resist coating, reduced projection of a pattern onto a resist, resist development, and various coating operations of insulating films, metal films and the like for filling gaps formed by copper lines are known.

Said dot marking is generally conducted irradiation of a continuous pulse laser beam on a partial surface of a semiconductor wafer through an optical system. In addition, marking is not performed only once, and minimum necessary historical data is often marked in the manufacturing steps to indicate the historical characteristics of the manufacturing steps. On a semiconductor wafer subjected to dot marking, information is generally read as a change in reflectance caused by irradiation of a laser beam of a He-Ne laser or a change in vibration of the heat wave of a conventional laser beam. Various manufacturing conditions in the subsequent manufacturing steps are set on the basis of the read information.

Processing histories in manufacturing steps of a wafer or a semiconductor or varying historical information such as historical characteristics of lots can be indicated by dot marks formed on a front surface of an orientation flat portion of a wafer, a rear surface of a wafer, or a wafer peripheral surface as disclosed in Japanese Patent Application Laid-Open No. 7-201688.

Moreover, in recent years, as Applicant suggests in Japanese Patent Application No. 11-333824 and Japanese Patent Application Laid-Open No. 2000-23382, the shape of a dot mark is reduced in size to vertical dimensions of 0.01 to 5 $\mu$m and a maximum width of 1 to 15 $\mu$m, and a dot shape which is good in visibility can be formed. Consequently, dot marking areas has greatly expanded. For example, marking can be conducted on such minute areas as a planar surface of a scribe line for cutting a semiconductor wafer to the dimensions of semiconductor chips, a planar surface of an upper and lower chamfering portions of a wafer rim, and, moreover, a planar surface of upper and lower chamfering portions of a V-notch serving as a reference mark for positioning formed on a wafer rim.

Meanwhile, various positioning apparatuses for setting wafers at predetermined positions have been proposed for exposure and transferring steps for a wafer in a conventional semiconductor-element-manufacturing device. For instance, Japanese Patent Application Laid-Open No. 4-212436 and Japanese Patent Application Laid-Open No. 6-45226 suggest devices to further increase positioning accuracy and speed.

In such conventional wafer positioning apparatus including the wafer positioning devices disclosed in these publications, the position of a reference mark such as an orientation flat or a V-notch formed on a wafer rim is detected, and positioning is conducted by moving the wafer to three axial directions of x, y and z to adjust the detected position to a predetermined position.

Since said orientation flat surface or said scribe line exists on a smooth surface side of a wafer, it is not technically difficult to orthogonalize an optical axis to the beam irradiation surface of the orientation flat surface or the scribe line in positioning of the marking by irradiation of a laser beam because the wafer surface is entirely smooth.

However, the chamfering portions of the wafer rim or the V-notch are extremely minute areas with width of about several hundred micrometers in the radial direction, and the tilt angles of these chamfering portions are not always constant. Therefore, when positioning is performed on such a minute area, a planar portion of a chamfering area must be precisely detected, and the irradiated optical axis of a laser marker must be orthogonalized accurately to the planar portion for following reasons:

(1) When an image-forming position of a processing system is considerably out of a wafer peripheral surface, the machining system becomes out of focus and high-quality processing cannot be performed. Even the marking itself sometimes becomes impossible.

(2) Influence on marks in the manufacturing steps depends on bevel surface positions of the wafer peripheral surface. An upper part of the mark may be erased with only its lower part remaining, or vice versa. In this case, the mark cannot be recognized in the subsequent steps, and management of wafers is disturbed.

(3) With respect to a reading device, if marking is not performed to a determined position, the mark may be out of a predetermined light-intensity range, or mark recognition may become difficult because the reading device is out of focus.

For these reasons, accuracy higher than that of conventional positioning is required in order to decide a forming position of fine dot marks formed on a minute area. Such accuracy is a severe requirement unnecessary for mere dot marking by punching on the front and rear surfaces of a semiconductor wafer. Not only the visibility but also the accuracy must be specially considered upon marking.

Therefore, Applicant proposed a processing apparatus which can efficiently read and write fine dot marks on such minute areas in Japanese Patent Application Laid-Open No. 2001-235309 (Device for Optically Detecting and Processing Surface to be Processed) and Japanese Patent Application No. 2000-284617 (Apparatus and Method for Optically Processing Planar Part of Notch-beveled Part of Semiconductor Wafer). A basic detection mechanism for a read/write position disclosed in these publications uses a change in light intensity at the planar portion of a chamfer of a V-notch on a minute area.

The device for optically detecting and processing surface to be processed according to said Japanese Patent Application Laid-Open No. 2001-235309 can optically detect the planar portion of the chamfer of a V-notch on a minute area and, at the same time, can automatically perform positioning of the processing apparatus.

More specifically, the optical axis of an image pickup unit arranged on a bisector of an angle between optical axes of a light-projection unit and a light-receiving unit is set to be orthogonalized to the planar portion of the chamfer of the V-notch on the minute area. Then, incident light scans along the planar portion of the chamfer, so that the change in light intensity on the planar portion of the chamfer is captured as a predetermined change in light intensity. The change in light intensity is detected through a photoelectric transfer element and, simultaneously, this light is used as illumination light of the image pickup unit. Image of the surface of the detected surface is picked and displayed on a monitor or the like. The image pickup unit is finely adjusted to be focused on the planar portion of the chamfer, and a desired optical process is performed thereto.

Meanwhile, in the apparatus and method for optically processing planar part of notch-beveled part of semiconductor wafer according to Japanese Patent Application No. 2000-284617, an automatic focusing laser beam of a processing apparatus having an automatic focusing mechanism is used as light of light-projection and light-receiving units without using the light-projection and light-receiving units described in said Japanese Patent Application Laid-Open No. 2001-235309.

More specifically, the planar portion of the chamfer or the optical axis of the laser beam is moved, and a change in reflected light intensity at the planar portion of the chamfer is detected in order to adjust the optical axis of the automatic focusing laser beam projected on the planar portion of the chamfer to the normal of the planar portion of the chamfer. The reflected light intensity at the planar portion of the chamfer increases, and a position with maximum light intensity is detected. When the position is detected, the normal of the planar portion of the chamfer coincides with the optical axis of said laser beam, and the processing apparatus is opposed to the planar portion of the chamfer. Subsequently, the automatic focusing mechanism is operated such that the focal point of an optical image on the planar portion of the chamfer is automatically adjusted to an image-receiving area of the image pickup unit, and a desired optical process is performed to the planar portion of the chamfer.

By the way, the peripheral surfaces of wafers do not always have uniform external shapes and depend on wafer types and lots. In addition, even if the bevel surface of a wafer peripheral surface is uniform, the semiconductor wafer is not always placed and set within the same plane with respect to an alignment stage having a plurality of wafer-clamping units for supporting the wafer rim. Furthermore, the sectional shapes of wafer peripheral surfaces vary depending on wafer manufacturers as shown in FIG. 10, and about 10 types of wafers exist so far.

When positioning is performed to any one of a central planar portion of a wafer peripheral surface constituting of a minute area or a planar portion of a bevel surface formed on front and rear faces of the rim of the wafer, techniques disclosed in said Japanese Patent Application Laid-Open No. 2001-235309 or said Japanese Patent Application No. 2000-284617 can be used. In this case, when incident light scans along a predetermined area of the central planar portion or the planar portion of the bevel surface, a change in light intensity on the planar portion must be detected to accurately detect the planar portion. At the same time, fine adjustment of the optical system must be done for accurately orthogonalizing the irradiation optical axis of the laser marker to said planar portion and for subsequent focusing.

With these techniques, a dot-mark-forming position can be accurately recognized during scanning with respect to a minute area in the circumferential direction of the wafer, said area having a width of about several hundred micrometers in the radial direction of a wafer peripheral surface. In contrast, an irradiation area cannot be identified with respect to a minute area in the direction of thickness of the peripheral surface of a wafer. Therefore, on the central planar portion of the wafer peripheral surface or the planar portion formed on the front and rear surfaces of the wafer rim, the irradiation optical axis of the laser marker cannot be accurately adjusted to a predetermined marking area, especially, a specific marking area in the direction of thickness of the wafer. This means that marking positions are not always accurate when marking is performed to wafers having various peripheral surface shapes as described above.

As a matter of course, it is impossible to visually check where the wafer minute areas having dimensions in the directions of thickness of about several hundred micrometers at planar portions of a wafer peripheral surface and detected by the above detection method are located in the direction of thickness of the wafer. Therefore, the above operations are repeated from the start for the respective wafers, and marking must be performed while accurately positioning the peripheral surfaces of the wafers. Consequently, the marking operation is cumbersome. In addition, even though above-described operations are repeated, accurate marking on predetermined area is not always performed.

Each time marking is performed to wafers having different outer shapes of wafer peripheral surfaces, above-mentioned operations are repeated from the start, and positioning of a dot-mark-forming area must be conducted. Consequently, setting of the apparatus is time-consuming, and an actual operation time rate decreases. For example, several ten seconds are required at present for positioning of a dot-mark-forming area by using the detection method. Accordingly, when multi-product, small-lot-sized production is performed in manufacturing semiconductor devices, not only production efficiency decreases, but also promotion of automatization of semiconductor manufacturing steps is hampered.

SUMMARY OF THE INVENTION

The present invention has been developed in consideration of circumstances as mentioned above. Its object is to provide a method and an apparatus for determining a dot-mark-forming position of a semiconductor wafer which can fix a minute and local marking area of a wafer peripheral surface visually/automatically, promptly and accurately, perform positioning promptly and precisely, and accurately conduct a fine optical process to a desired marking area.

For accomplishing above-mentioned tasks, especially for solving the problem that the dot-mark-forming position cannot be accurately specified in the direction of thickness of the wafer, the shape of the periphery of the dot-mark-forming area must be precisely known. In addition, especially for solving a problem that a long time is required for detecting the dot-mark-forming position and adjust it to a processing system, the frequency of human determination and mechanical positioning operations must be decreased as much as possible. The present invention has been accomplished in view of such tasks.

According to the first aspect of the present invention, there is provided a method of determining a dot-markforming position of a semiconductor wafer including the steps of: picking an image of a sectional shape of a rim of the semiconductor wafer; determining a dot-mark-forming position based on image data obtained by the image pickup; and moving relatively at least one of the semiconductor wafer or a processing system so that the determined dot-mark-forming position equals the image-forming position of the processing system.

In this aspect, the present invention also includes the step of displaying the picked image obtained by the image pickup on an image-display device to calculate a desired dot-mark-forming position or the like on the displayed image or the step of automatically calculating the desired dot-mark-forming position inside a control unit on the basis of the image data obtained by the image pickup. The processing system according to the present invention includes forming and reading systems of dot marks.

According to the present invention, when dot marks are formed on planar areas of the rims of semiconductor wafers of the same type, as in the conventional art, the first semiconductor wafer is positioned on a predetermined alignment stage and fixed thereto. Then, the position of a V-notch formed on the rim of the semiconductor wafer positioned and fixed as described above is specified by, for instance, an optical-system detection means, and dot marks are formed on a predetermined area on the rim of the semiconductor wafer. At that time, a relative moving means is rotationally controlled to move the marking area onto the optical axis of the processing system. All of the control data are stored in the control unit.

Meanwhile, in the present invention, a light irradiation source is arranged at one side of the marking area, and an image pickup device is arranged at the opposite side across the marking area. The image pickup device picks the image of the sectional shape of the periphery of the dot mark area of the semiconductor wafer. For the sectional image obtained by the image pickup, a position on the wafer peripheral surface, especially in the direction of thickness, where dot marks are to be formed or read is determined and the control unit stores its data. The control unit calculates a shift length between the determined dot-mark-forming position and the image-forming position of the processing system. Then, the relative moving means is driven depending on the positional shift length to controllably move at least one of the semiconductor wafer or the processing system. In this manner, the predetermined dot-mark-forming position is mechanically adjusted to the image-forming position of the processing system. The processing system is driven to finely adjust its focal point, and desired marking or mark reading is performed on the dot-mark-forming position.

By employing the above method; time required for positioning, including image pickup, calculation and wafer moving operation, becomes considerably shorter compared with a conventional method for determining a dot-mark-forming position. The dot-mark-forming position can be not only positioned efficiently, but also determined at an arbitrary position in the direction of thickness of the wafer peripheral surface. Furthermore, accuracy of positioning with the method of the present invention improves remarkably if setting conditions such as size of the wafer peripheral surface, an image pickup area, number of pixels of a CCD (or a line sensor), image processing performance, and the accuracy of a moving mechanism are selected appropriately.

In addition, since a picked image can be easily stored in a storage unit, even if the type of products is changed in multi-product production, detection can be started immediately by loading the data from the storage unit. Moreover, the data is considerably useful for analysis, judgement and the like upon defection in the processes. Therefore, according to the method of the present invention, the following excellent effects can be obtained.

1. High-speed and accurate positioning can be realized.
2. This method can be applied to different wafer peripheral surface shapes.
3. Time required for positioning is short.
4. Defect analysis or the like can be performed.
5. A dot-mark-forming position on a minute area with a width of several hundred micrometers in the thickness direction of a wafer peripheral surface can be grasped accurately.

Preferably, the above-described method according to the present invention includes the steps of: cutting out a cutout image with predetermined shape and area from a sectional image of a peripheral surface of a semiconductor wafer; determining the dot-mark-forming position on the sectional image in the cutout image; calculating a cutout position ($X_1$, $Z_1$) of the cutout image on the image-pickup screen; calculating the determined dot-mark-forming position as biaxial plane coordinates $x_1$ and $z_1$ of the cutout image; calculating a dot-mark-forming position ($X_2$, $Z_2$) on the image-pickup screen from the cutout position ($X_1$, $Z_1$) and the dot-mark-forming position ($x_1$, $z_1$) on the semiconductor wafer; determining a relative moving length from the dot-mark-forming position ($X_2$, $Z_2$) on the screen and an image-forming position ($X_3$, $Z_3$) of the processing system; and moving at least one of the semiconductor wafer or the processing system by relative moving means to adjust the dot-mark-forming position ($X_2$, $Z_2$) to the image-forming position ($X_3$, $Z_3$) on the basis of the relative moving length.

In this invention, a positional shift length between the dot-mark-forming position of the semiconductor wafer and the image-forming position of the processing system is calculated by comparing coordinate values. According to this invention, the cutout position ($X_1$, $Z_1$) of a cutout image (window for inspection) with predetermined shape and size on a peripheral portion of a desired dot-mark-forming position is set for the picked sectional image of the peripheral surface of the semiconductor wafer. Then, the desired dot-mark-forming position determined on the sectional image in the cutout image is calculated as the biaxial plane coordinates ($x_1$, $z_1$) of the cutout image.

Subsequently, the dot-mark-forming position ($X_2$, $Z_2$) on the image-pickup screen is calculated on the basis of the cutout position ($X_1$, $Z_1$) at the cutout image and the biaxial plane coordinates ($x_1$, $z_1$) of the dot-mark-forming position. Then, a shift length between the dot-mark-forming position ($X_2$, $Z_2$) on the image-pickup screen and the image-forming position ($X_3$, $Z_3$) of the processing system, which is displayed on the same screen as that of the sectional image, is calculated. The shift length is transmitted to the control unit as a difference (positional shift length) between the X-coordinate and the Z-coordinate. The relative moving means is controllably moved on the basis of the positional shift length ($X_3-X_2$, $Z_3-Z_2$). In this manner, the dot-mark-forming position ($X_2$, $Z_2$) can be adjusted to the image-forming position ($X_3$, $Z_3$). The processing system is driven to automatically perform a general focusing operation, and a desired process for the dot-mark-forming position ($X_2$, $Z_2$) is conducted.

According to this method, even though a special programming technique is not used, complexity of software process can be reduced, and image processing speed can be increased. In addition, the dot-mark-forming position ($X_2$, $Z_2$) and the image-forming position ($X_3$, $Z_3$) are promptly corrected on the cutout image, even if a wafer is not set at the position completely equal to the previous position, the position of a sectional shape in the cutout image is shifted from the previous one or the cutout position of the cutout image is shifted because of the difference in the outer shapes of wafer peripheral surface or a machining error or an assembling error at an alignment stage. Consequently, mechanical positioning operation can be performed at high speed and accuracy.

More preferably, the above-mentioned method according to the present invention includes the steps of: calculating a singular point of the sectional image in the cutout image as a reference point ($x_2$, $z_2$); and calculating the dot-mark-forming position ($x_1$, $z_1$) on the cutout image with reference to the reference point ($x_2$, $z_2$). Said reference point ($x_2$, $z_2$) is preferably a point (singular point) which does not vary between semiconductor wafers of the same lot, for example, a middle point in a direction of thickness at the central planar portion of the wafer peripheral surface. In order to calculate the dot-mark-forming position ($x_1$, $z_1$), the reference point ($x_2$, $z_2$) is calculated and then, coordinates ($x_2$+a, $z_2$+b) shifted from the reference point by a in the x-axis direction and by b in the y-axis direction is calculated. In this manner, when the dot-mark-forming position ($x_1$, $z_1$) is calculated based on the reference point ($x_2$, $z_2$), the dot-mark-forming position can be more objectively specified.

Still more preferably, the above-mentioned method according to the present invention includes the steps of: comparing a pre-stored sectional shape of a semiconductor wafer with a picked image of a sectional shape of a semiconductor wafer to recognize the type of the picked sectional shape image; and determining a dot-mark-forming position according to the recognized sectional shape.

In this invention, various sectional shapes of semiconductor wafers are stored in the storage unit as standard patterns, and a picked image of a wafer sectional shape which is a targeted pattern is sequentially compared with the standard patterns to determine degrees of equality. All patterns of targeted sectional shapes or characteristic partial patterns may be stored in advance as the standard patterns. This method has versatility because stored data of these patterns can be easily changed.

In addition, for wafers of different types, a dot-mark-forming position need not to be determined from the beginning each time the wafer with a different outer shape of the wafer peripheral surface is processed, unlike in conventional arts. The targeted pattern just needs to be overlapped to the various standard patterns to calculate and determine degrees of similarity. Accordingly, an actual operation time rate required for a mechanical positioning operation can be considerably reduced. Therefore, multi-product, small-lot-sized production can be efficiently performed in manufacturing semiconductor devices, and automatization of semiconductor manufacturing steps can be effectively achieved.

Still more preferably, the above-mentioned invention according to the present invention includes the steps of: storing information data related to the picked images of the sectional shapes of the semiconductor wafers and varying processing information; and analyzing causes of defects in processing based on said information data.

This invention is characterized in that data information related to the picked images of the sectional shapes of the semiconductor wafers and varying processing information are intermittently or continuously monitored. When abnormality which blocks normal processing occurs, various abnormalities related to stored sectional shapes of semiconductor wafers, dot-mark-forming positions, and the like can be immediately determined, and can be used as investigation materials for causal association of abnormal phenomena. Thus, various maintenance steps can be easily performed, and stable processing can be always performed effectively.

According to the second aspect of the present invention, there is provided an apparatus for determining a dot-mark-forming position of a semiconductor wafer including: image-pickup means for picking an image of a sectional shape of a peripheral surface of a semiconductor wafer; a processing system in which an irradiation optical axis is arranged in advance to be substantially orthogonal to an optical axis of the image-pickup means; calculation means for determining a dot-mark-forming position on the basis of picked image data; and relative moving means for relatively moving at least one of the semiconductor wafer or the processing system such that the dot-mark-forming position determined by said calculation means equals an image-forming position of the processing system.

The present invention, as in the invention related to the above method, includes a case in which a dot-mark-forming position or the like is automatically processed inside a control unit without performing a process of temporarily displaying a picked image on an image display device to calculate a dot-mark-forming position or the like. In the apparatus of the present invention, the optical axis of illumination light of the image-pickup means as described above is arranged in advance to be substantially orthogonalized to the optical axis of the image-pickup means at a position crossing a part of the peripheral surface of a semiconductor wafer. Meanwhile, a control drive unit of the relative moving means is controllably moved, for example, in biaxial directions, or horizontal directions and vertical directions of x' and z', from the wafer center serving as an origin, and can controllably rotate about a z' axis and be tilted about a y" axis.

According to the above structure, sectional-image information of the wafer peripheral surface picked by the image-pickup means is transmitted to the calculation unit, and a dot-mark-forming position of the semiconductor wafer is calculated by the calculation means. Accordingly, the relative moving means can be movably controlled on the basis of control signals transmitted from the calculation means. In this manner, according to the present invention, the image of the fine peripheral surface of the semiconductor wafer is picked as a sectional image by the image-pickup means, a desired dot-mark-forming position which is a part of the sectional image is calculated, and rapid data transmission can be realized.

Consequently, the relative moving means can be positioned promptly and accurately with respect to the irradiation optical axis of the processing system. Thus, desired processes for the dot-mark-forming position are stabilized, so that stable accuracy of positioning can be maintained.

Preferably, in the above apparatus according to the present invention, the calculation means includes: a calculation unit for calculating a cutout position ($X_1$, $Z_1$) of the cutout image on the image-pickup screen, calculating the determined dot-mark-forming position as biaxial plane coordinates ($x_1$, $z_1$) of the cutout image, and calculating a dot-mark-forming position ($X_2$, $Z_2$) on the image-pickup screen from the cutout position ($X_1$, $Z_1$) and the dot-mark-forming position ($x_1$, $z_1$) on the semiconductor wafer; a position-setting unit for determining the dot-mark-forming position on the sectional image in the cutout image; an image-forming-position-setting unit for setting an image-forming position ($X_3$, $Z_3$) of the processing system on the image-pickup screen; and a comparative calculation unit for determining a relative moving length from the dot-mark-forming position $(X_2, Z_2)$ on the image-pickup screen and the image-forming position $(X_3, Z_3)$.

The basic positioning apparatus according to this invention employs the above calculation means to calculate a positional correction, a rotational shift, and the like between the dot-mark-forming position of the semiconductor wafer and the image-forming position by comparing coordinates on the image-pickup screen.

According to the above structure, even though a special hardware technique is not used, a determining process of a moving length of the semiconductor wafer can be performed by comparing coordinates on the image-pickup screen, and, at the same time, a positional shift or the like in the x'- and z'-axis directions on a minute area with a dimension of about several hundred micrometers can be precisely corrected. Therefore, a series of operations for positioning a wafer can be realized with a high speed, high function, and high determination performance.

More preferably, in the above apparatus according to the present invention, the calculation means includes a pattern recognition unit for comparing a pre-stored sectional shape of a semiconductor wafer with a picked image of a sectional shape of a semiconductor wafer to determine the type of the picked sectional-shape image. The dot-mark-forming position is decided according to the sectional shape determined by the pattern recognition unit.

In this invention, when programmed information of various types of sectional images are stored in a storage unit for different products in advance, when the arrangement is changed, for example, the type of the picked sectional image of the semiconductor wafer is determined by the pattern recognition unit, and the dot-mark-forming position $(X_2, Z_2)$ on the image-pickup screen can be automatically determined from the preset dot-mark-forming position according to the determined sectional shape of the wafer.

According to the above structure, the sectional images of variable wafers can be freely set. Consequently, the arrangement can be easily changed, and advanced processes with high versatility and flexibility can be performed on different wafer types.

More preferably, in the above apparatus according to the present invention, the calculation means includes a storage unit for storing information data related to the picked images of the sectional shapes of the semiconductor wafers and various processes. Causes of defects in processing are analyzed based on the information data related to the sectional shapes, various processes, and the like called from the storage unit.

In this invention, not only the various wafer-sectional images are set in advance as described above, but also various information data related to the picked images of the sectional shapes of the semiconductor wafers, the dot-mark-forming positions, and the like are stored in the storage unit. The picked images of the sectional shapes of the semiconductor wafers stored in the storage unit, attitudes of semiconductor wafers, and the like can be analyzed to investigate abnormalities of the positioning apparatus or defects of wafers. In addition, the stored data can also be used for maintenance and checking operations and as management data. Consequently, various processes can be stabilized.

DETAILED DESCRIPTION OF THE PREFERRED EMBODIMENT

Hereinafter, a preferable embodiment of the present invention is described below with reference to the accompanying drawings.

Figure 1:
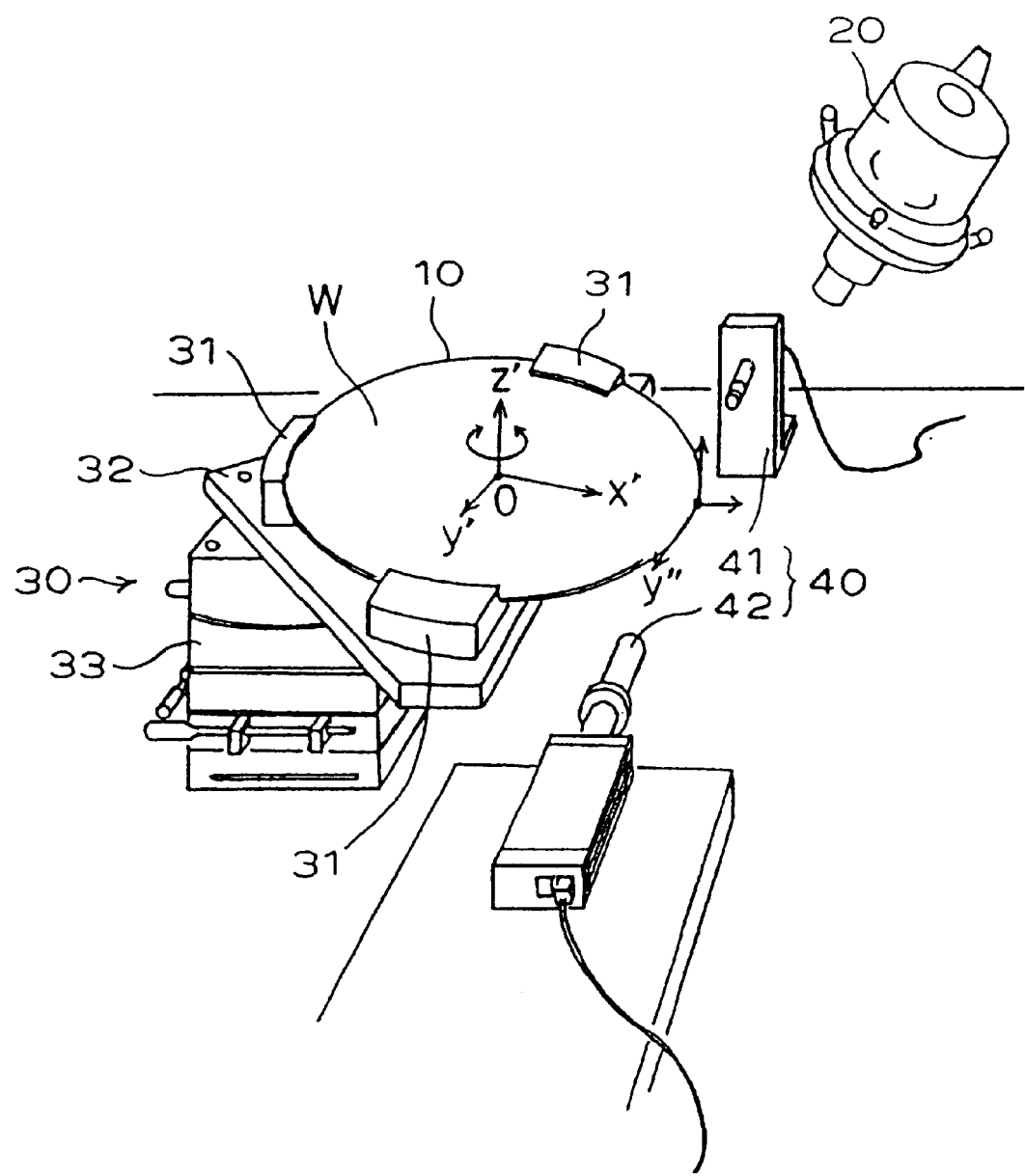
FIG. 1 is a schematic diagram of an apparatus for determining a dot-mark-forming position according to an embodiment of a mark-forming apparatus for a peripheral-surface portion of a semiconductor wafer according to this invention.
Figure 2:
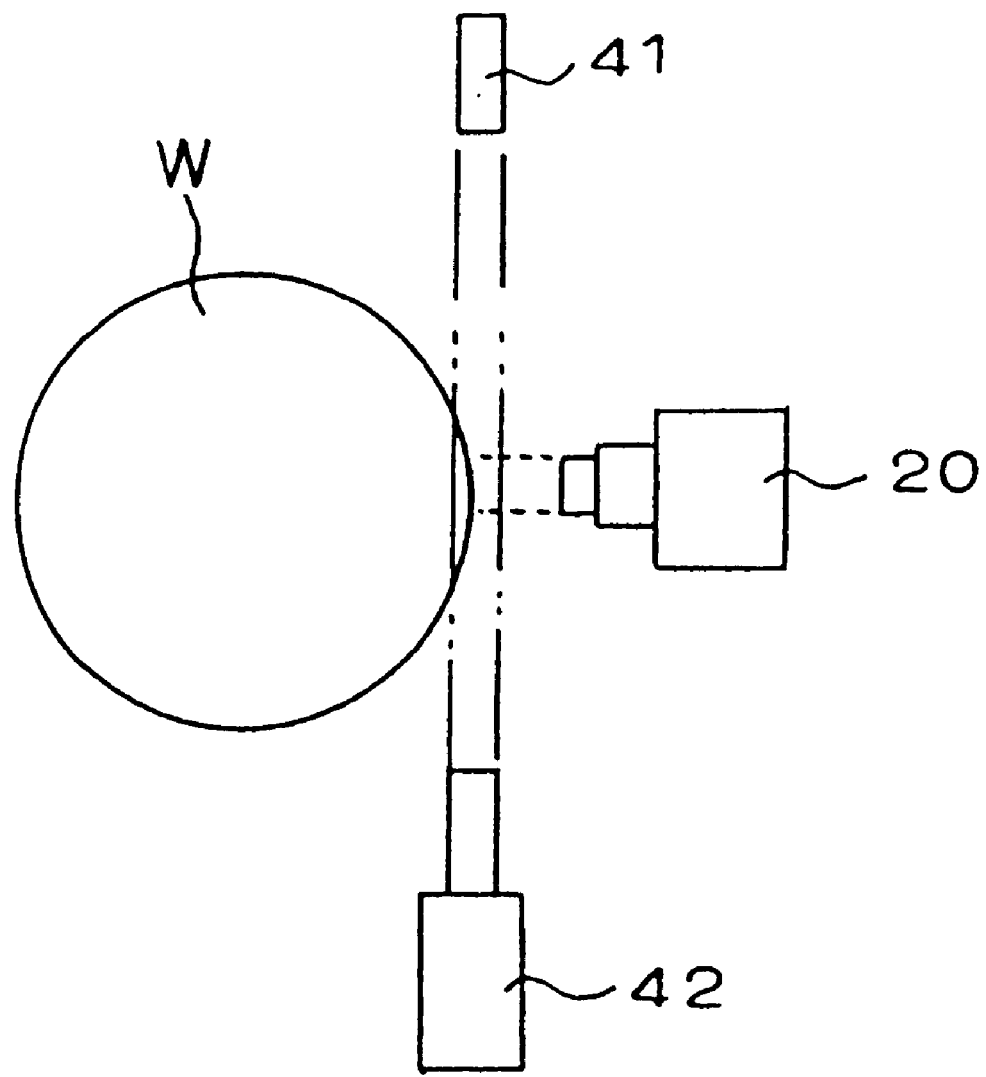
FIG. 2 explains a relationship between the optical axes of an image-pickup means and a machining processing unit in the positioning apparatus.
Figure 3:
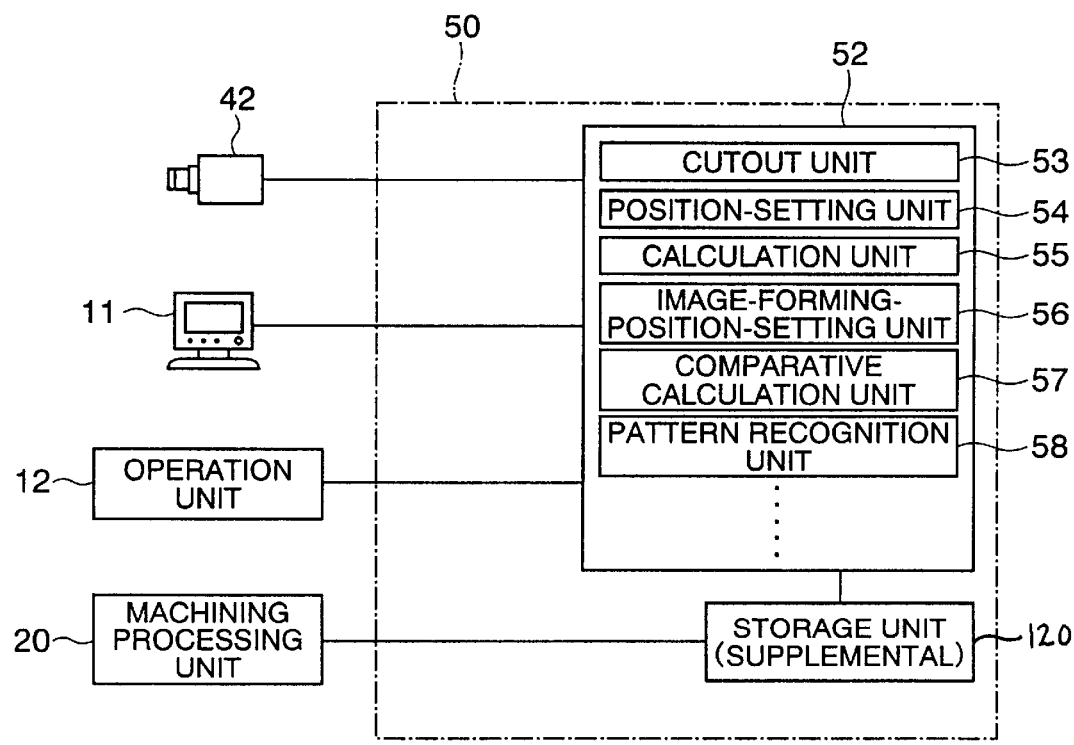
FIG. 3 is a functional block diagram showing a schematic structure of a calculation means applied to the positioning apparatus.
Figure 4A:
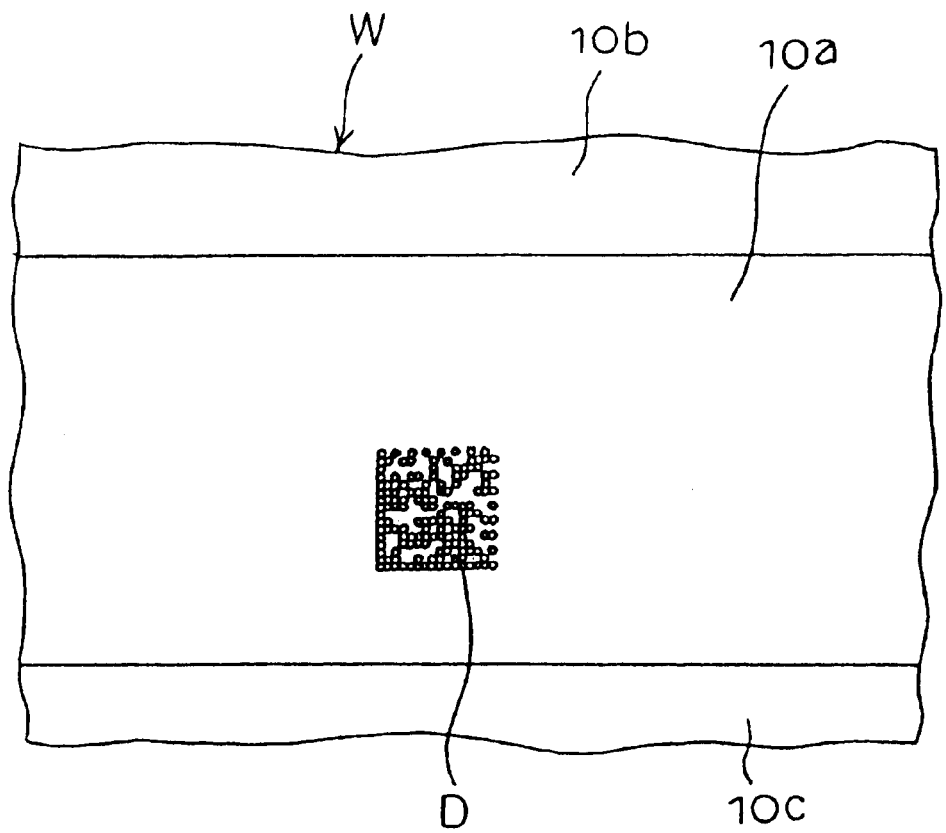
FIGS. 4A and 4B are partial plan views schematically showing an example of fine-dot-mark formation.

FIG. 1 shows a schematic structure of an apparatus for determining a dot-mark-forming position which is an embodiment of a mark-forming apparatus for a peripheral surface portion of a semiconductor wafer according to this embodiment. FIG. 2 shows a relationship between the optical axes of an image-pickup means and a machining processing unit in the positioning apparatus. FIG. 3 shows a schematic structure of a calculation means in the positioning apparatus. FIG. 4 schematically shows an example of fine-dot-mark formation. Although a laser marker is used as the machining processing unit in this embodiment, etching, lithography, or the like can be also used.

In this embodiment, a marking process for forming dot marks by using a laser marker as a machining processing unit 20. However, a reading processing unit such as a CCD camera device or a lens system for picking images may be used in place of the machining processing unit 20. With respect to such a dot-mark-reading process, the positioning apparatus and the method described in this embodiment can be effectively applied, too.

In this embodiment, as shown in FIG. 4, a planar portion area detected by the machining processing unit 20 is determined as an upper planar portion 10a which is a minute chamfered area of a peripheral surface 10 of a semiconductor wafer W on which dot marks D are formed. Yet, the dot marks D can be formed also on the planar portion of the chamfered area formed on a lower ridge portion of the peripheral surface 10 of the semiconductor wafer W, a central planar portion 10c of the peripheral surface 10, or the like.

Figure 4B:
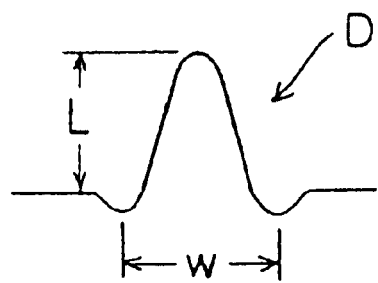

As shown in FIG. 4B, a dot mark D formed on the planar portion 10a has a minute size with its vertical dimension of 0.01 to 5 μm and a maximum width of 1 to 15 μm. In a typical shape of the dot mark D, its central portion is elevated from the surface of the planar portion 10a, thus the dot mark D has high visibility. The dot mark may have a concave-hole shape, which is widely known. Applicant has proposed a method of forming the fine dot mark with its central portion elevated in Japanese Patent Application Laid-Open No. 2000-223382. Detailed description of this method will be omitted in this Specification because its details are explained on the Specification of said application.

According to this embodiment, when the machining processing unit 20 is fixed, the setting position of the machining processing unit 20 is desirably set as immobile as possible when the dot-mark-forming position of the tilted planar portion 10*a* is detected and the dot marks D formed on the planar portion 10*a* are to be written. In this embodiment, an alignment unit for positioning and fixing the semiconductor wafer W, which is a marking object, is used as a relative moving means 30 and the semiconductor wafer W is controllably moved such that the machining processing unit 20 needs not to be moved after it is once set. Meanwhile, the machining processing unit 20 may be moved when the semiconductor wafer W has been aligned.

In this embodiment, as shown in FIG. 1, the semiconductor wafer W is placed and set on an alignment stage 32 provided with three wafer-clamping units 31 for supporting the rim of the semiconductor wafer W at three points. Said alignment stage 32 is constituted so as to be controllably moved in three axial directions (x', y', z'), which are horizontal and vertical directions, from a wafer center 0 as an origin by a control driving unit 33 connected to a control drive source (not shown), controllably rotate about the z' axis, and be tilted about an y" axis, which is a normal direction of the peripheral surface of the semiconductor wafer W parallel to the optical axis of an image-pickup means 40.

Meanwhile, the position of, for example, a V-notch, which is a reference mark for positioning and is formed on the wafer rim, must be detected first in order to orthogonalize a dot-mark-forming laser beam of the machining processing unit 20 to a marking area. An optical detection means such as a photoelectric tube is generally used to specify the position of the V-notch.

After the V-notch position is detected, the alignment stage 32 is rotated at a predetermined angle about the z' axis to position and fix the semiconductor wafer W. Focusing is performed after the positions of the wafer and the processing system are adjusted to each other. The Applicant has described a principle for positioning and fixing the semiconductor wafer W on the alignment stage 32 in the Japanese Patent Application No. 2000-284617. This principle can also be employed in this embodiment. Detailed description of this method will be omitted in this Specification because its details are explained on the Specification of said application.

In this embodiment, the dot marks D, as shown in FIG. 4, are formed on the upper planar portion 10*a* of the chamfered portion of the wafer peripheral surface 10. The planar portion 10*a* is a very small area with its dimension of about several hundred micrometers in the radial direction of the semiconductor wafer W, and is tilted at a required angle with respect to a wafer surface 10*b*. This tilted surface does not always have a constant tilt angle among different types or lots of wafers.

Especially important points for obtaining identical mark shapes upon formation of the dot marks D are as follows. First, the tilt angle of the planar portion 10*a* with respect to the wafer surface 10*b* needs to be accurately known to assure positioning accuracy at a minute portion of the semiconductor wafer W with respect to the machining processing unit 20. Second, the irradiation optical axis of a laser beam of the machining processing unit 20 needs to be arranged to be accurately orthogonal to the marking area. In addition, time required for adjusting the position of the relative moving means 30 with respect to the machining processing unit 20 needs to be reduced.

With respect to the small area in the wafer peripheral surface direction, the semiconductor wafer W is rotated at a predetermined angle about the z' axis with reference to the V-notch and then tilted about the y" axis, so that a position of the marking area in the wafer peripheral surface direction can be accurately known. However, where in the minute area in the radial direction of the wafer peripheral surface is marked cannot be determined with the above method only.

Therefore, this embodiment comprises the image-pickup means for picking the image of the sectional shape of the peripheral surface of the wafer W, a calculation unit 50 for determining a specific position in the radial direction of the tilted surface of the rim of the wafer W as a forming position of the dot marks D, and a relative moving means 30 for operating the alignment unit to relatively move the wafer W such that the forming position of the dot marks D equals the marking position displayed on the image-pickup screen.

More specifically, the image-pickup means 40 has an illumination device 41 provided on one side of the marking area and a CCD camera device 42 provided on the opposite side. The image-pickup means 40 irradiates light from the illumination device 41 toward a part of the peripheral surface of the semiconductor wafer W. Then, the sectional shape of the peripheral portion of the dot-mark-forming position on the wafer W is picked by the CCD camera device 42 arranged in the irradiation direction. The CCD camera device 42, as shown in FIG. 3, is connected to the calculation unit 50. FIG. 5 schematically shows the sectional image of the wafer peripheral surface. The optical axis of the illumination light of the illumination device 41, as shown in FIG. 2, is set at a position crossing a part of the peripheral surface of the wafer W and orthogonal to the laser optical axis of the machining processing unit 20.

As shown in FIG. 3, digital video signals obtained by an image pickup operation of the CCD camera device 42 are input to the calculation unit 50 of a control unit 52. An image display device 11 is connected to the control unit 52, so that the sectional image of the wafer peripheral surface picked by the CCD camera device 42 is enlarged and displayed on said display device 11.

Figure 5A:
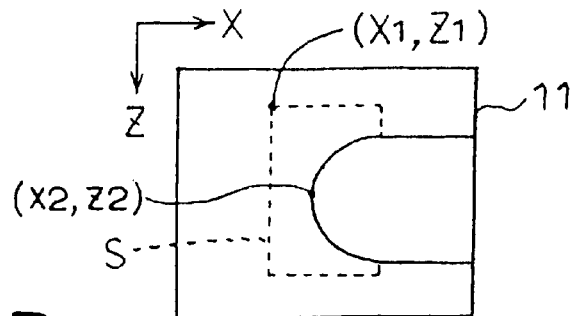
FIGS. 5A to 5D schematically show sectional images of a wafer peripheral surface.

The control unit 52 gives a command to a cutout unit 53 for a cutout image S. Then, as shown in FIG. 5A, said control unit 52 determines a cutout position ($X_1$, $Z_1$) of the cutout image S having predetermined rectangular shape and area such that the peripheral portion of a desired dot-mark-forming position is included in the sectional image on the image-pickup screen. The position coordinates of the cutout position ($X_1$, $Z_1$) of the cutout image S are calculated by a calculation unit 55. The dot-mark-forming position may be set by a person operating an operation unit 12. Yet, a model image can be stored in the control unit 52 in advance so that a predetermined portion on the model image is set as a dot-mark-forming position.

Figure 5B:
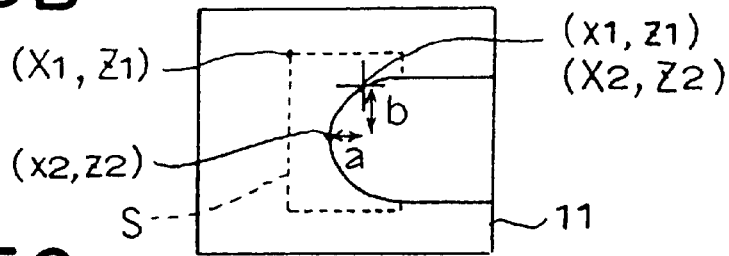

The control unit 52 gives a command to a position-setting unit 54 to determine a dot-mark-forming position on the sectional image in said cutout image S. Then, as shown in FIG. 5B, said control unit 52 determines a desired dot-mark-forming position, and calculates it as biaxial plane coordinates ($x_1$, $z_1$) of the cutout image S. These coordinates ($x_1$, $z_1$) are specified with a vertical central point ($x_2$, $z_2$) of the central planar portion 10c of the picked sectional image on the wafer peripheral surface as a reference point. Subsequently, the control unit 52 gives a command to the calculation unit 55 to calculate a dot-mark-forming position ($X_2$, $Z_2$) on the screen of the image display device 11 from the cutout position ($X_1$, $Z_1$) and the dot-mark-forming position ($x_1$, $z_1$).

When the dot-mark-forming position ($x_1$, $z_1$) is calculated, for example, the vertical central points ($x_2$, $z_2$) of the central planar portions 10c of the sectional images of all wafers W are determined as the reference points as described above, and the dot-mark-forming position ($x_1$, $z_1$) is set in advance on a position coordinates ($x_2$+a, $z_2$+b) shifted from said reference point ($x_2$, $z_2$) by a in the x-axis direction and by b in the y-axis direction. As a consequence, when the reference points ($x_2$, $y_2$) of all wafers W of the same type are calculated, the dot-mark-forming positions ($x_1$, $z_1$) are automatically determined, and the dot-mark-forming positions can be more objectively specified.

Figure 5C:
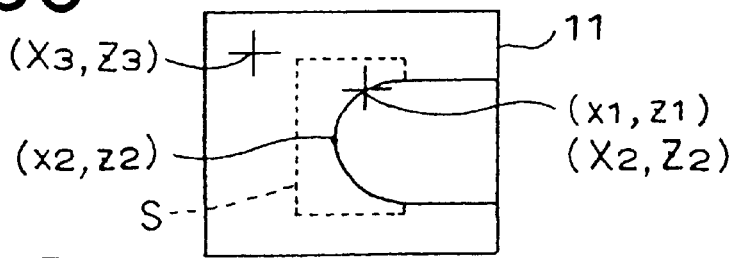

Meanwhile, a predetermined irradiation point of a laser beam of the machining processing unit 20 which irradiates a laser beam onto the wafer W is displayed on the image-pickup screen as a fixed coordinate point ($X_3$, $Z_3$), and the position data are also stored in the control unit 52. With respect to the irradiation point ($X_3$, $Z_3$) of the machining processing unit 20 displayed on the image-pickup screen by an image-forming-position-setting unit 56 based on the command of the control unit 52, a shift length of the dot-mark-forming position ($X_2$, $Z_2$) on the image-pickup screen as shown in FIG. 5C is calculated.

Figure 5D:
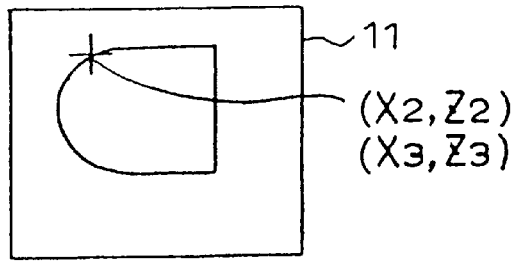

In this calculation, the dot-mark-forming position ($x_1$, $z_1$) on the cutout image needs to be converted into the dot-mark-forming position ($X_2$, $Z_2$) on the image-pickup screen by the calculation unit 55 of the control unit 52. After completion of the conversion, relative moving length and direction of the wafer W are determined in a comparison operation unit 57 based on the image-forming position ($X_3$, $Z_3$) of the machining processing unit 20 and the dot-mark-forming position ($X_2$, $Z_2$) on the image-pickup screen. Subsequently, the alignment stage 32 of the relative moving means 30 is controlled and operated according to the positional shift length ($X_3$–$X_2$, $Z_3$–$Z_2$). Consequently, as shown in FIG. 5D, the dot-mark-forming position ($x_1$, $z_1$) on the cutout image can be adjusted to the image-forming position ($X_3$, $Z_3$) of the machining processing unit 20 on the image-pickup screen as described above.

In addition, the control unit 52 comprises a pattern recognition unit 58 for comparing pre-stored various sectional shapes of wafers W1 to W4 as shown in FIGS. 10A to 10D to a picked sectional shape of the wafer W and recognizing the type of the picked sectional shape. The dot-mark-forming position ($X_2$, $Z_2$) on the image-pickup screen can be automatically determined on the basis of the dot-mark-forming position preset according to the sectional shape recognized by the pattern recognition unit 58. When the sectional images of the various types of wafers W1 to W4 are stored in advance, arrangement can be easily changed, and advanced processes with high versatility and flexibility can be performed on different wafer types.

In this manner, without using special hardware technique, there can be provided the determination process of the relative moving length and direction of the wafer W with comparison of coordinates on the screen of the image display device 11, and positional shifts or the like in x- and z-axis directions on a minute area with a size of several micrometers can be accurately corrected. Moreover, there can be provided an apparatus for determining a dot-mark-forming position which can perform a series of operations for positioning the wafer W with high speed, high function, and high determination performance.

In this embodiment, pixels in an image-processing range of the image display device 11 are allocated to an X-Z coordinate system on the image-pickup screen. In this way, the positional shift length is determined by cutting out the cutout image S with predetermined shape and area from the sectional image of the peripheral surface of the semiconductor wafer and comparing coordinates of the dot-mark-forming position of the wafer peripheral surface with a predetermined outer contour and an image-forming position of the machining processing unit 20. However, the sectional images of the wafer peripheral surfaces are not always picked at the same position on the image-pickup screen because of the difference in wafer-peripheral-surface sizes or image pickup areas. In addition, even though the bevel surfaces of the wafer peripheral surfaces are uniform, the wafers W are not always placed and set on the same plane at a position completely equal to the previous position depending on machining accuracy, assembling accuracy, or the like of the alignment stage 32. Furthermore, the position of the sectional shape in the cutout image S may be shifted from the previous position, or the cutout position of the cutout image S may be shifted.

Figure 6A:
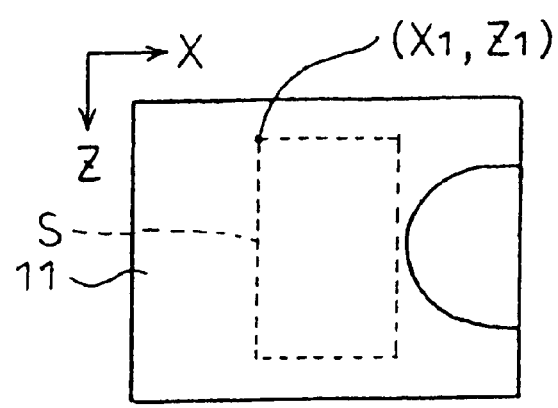
FIGS. 6A and 6B schematically show other sectional images of a wafer peripheral surface.
Figure 6B:
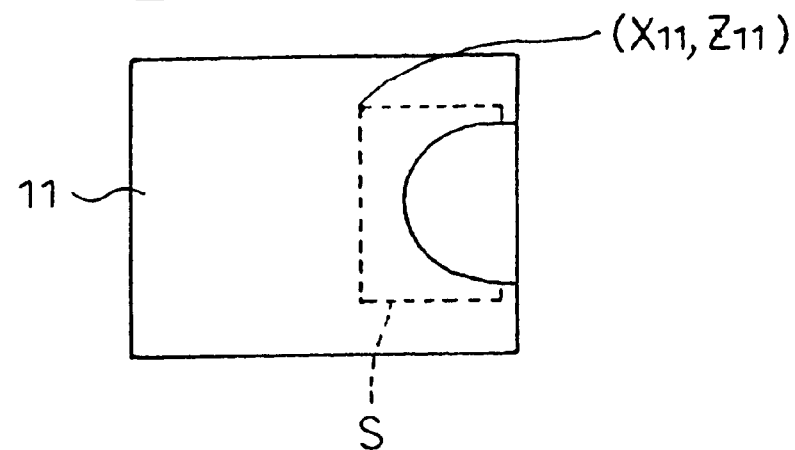

Therefore, according to the present invention, when the sectional image of the wafer peripheral surface displayed on the image-pickup screen is positionally shifted with respect to the preset cutout image S on the image-pickup screen as shown in FIG. 6A, the cutout image S can be arbitrarily parallel shifted according to the detected positional shift of the sectional image. This state is schematically shown in FIGS. 6A and 6B. The positional shift length of the sectional image is calculated by the calculation unit 55, and a cutout position ($X_{11}$, $Z_{11}$) after movement of the cutout image S is determined.

In this case, even if the outer shapes of wafer peripheral surfaces vary as described above, and the wafers are not placed and set on the same plane by the alignment stage 32, or the positions of the sectional shapes in the cutout images S are shifted from the reference point ($x_2$, $Z_2$), the pattern recognition unit 58 recognizes the difference of the wafer peripheral surfaces. Then, positional correction between the dot-mark-forming position and the image-forming position of the machining processing unit 20 is rapidly performed on the cutout image S, and the relative moving means 30 can be mechanically positioned with high speed and accuracy.

Figure 7:
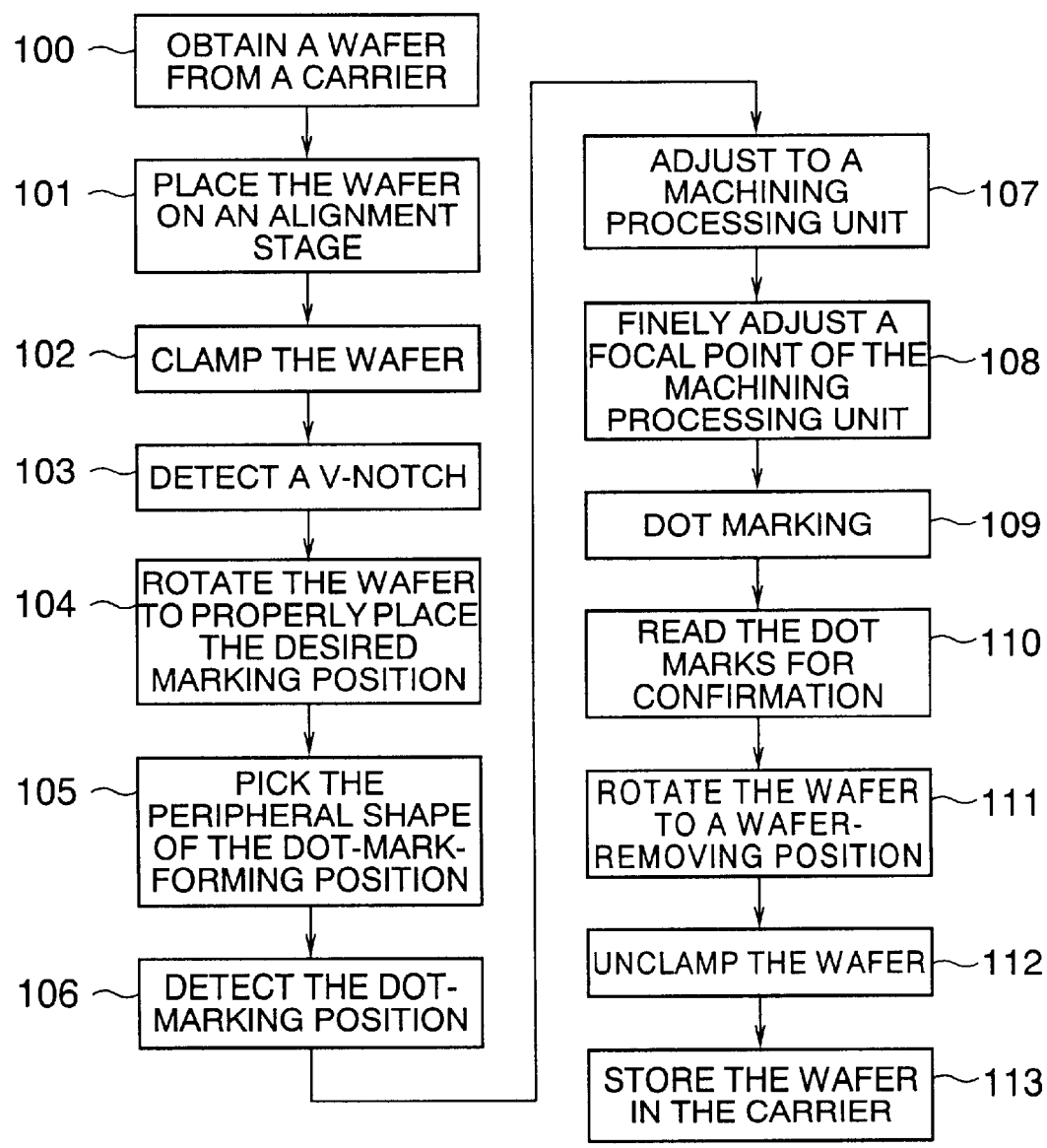
FIG. 7 is a flow chart showing an example of a control procedure of the positioning apparatus.

FIG. 7 shows an example of a procedure at the calculation unit 50 in the apparatus for determining a dot-mark-forming position according to the present invention. As shown in this figure, the processes start from a block 100, i.e., an arbitrary wafer W is obtained from a plurality of semiconductor wafers W stored in a wafer carrier (not shown).

In subsequent blocks 101 and 102, the wafer W is placed on the alignment stage 32 and set such that the rim of the wafer W is supported at three points by the three wafer-clamping units 31 as described above. In next blocks 103 and 104, as described above, the position of a V-notch formed on the wafer rim is detected by an optical detection means (not shown). Then, the wafer is rotated at a predetermined angle so that a marking area and a laser optical axis of the machining processing unit 20 may cross.

In a block 105, light from the illumination device 41 is irradiated onto a part of the wafer peripheral surface. Then, the CCD camera device 42 picks the image of the sectional shape of the peripheral portion of the dot-mark-forming position on the wafer W. If necessary, the picked sectional image of the wafer peripheral surface is enlarged and displayed on the image display device 11. Subsequently, the process shifts to a block 106.

In block 106, a command is given to the cutout unit 53 of the control unit 52 to cut the sectional image of the wafer peripheral surface picked by the preset cutout image S by the CCD camera device 42. Then, the cutout position $(X_1, Z_1)$ of the cutout image S on the image-pickup screen is calculated.

Meanwhile, in the marking-position-setting unit 54, a dot-mark-forming position is determined on the cutout image S. When the position is determined, a command is given to the calculation unit 55 to calculate the determined dot-mark-forming position as the biaxial plane coordinates $(x_1, z_1)$ of the cutout image S. Subsequently, the dot-mark-forming position $(X_2, Z_2)$ on the image-pickup screen is calculated from the cutout position $(X_1, Z_1)$ and the dot-mark-forming position $(x_1, z_1)$ on the semiconductor wafer. The determination of the dot-mark-forming position on the cutout image S by the position-setting unit 54 may be made by an operation signal of an external operation unit 12. Yet, the determination is performed by a command signal based on the internal process in the control unit 52.

Subsequently, a command signal from the control unit 52 is output, and a shift length between the image-forming position $(X_3, Z_3)$ of the machining processing unit 20 displayed on the image-pickup screen by the image-forming-position-setting unit 56 and the dot-mark-forming position $(X_2, Z_2)$ on the image-pickup screen is comparatively calculated by the comparison operation unit 57. Then, relative moving length, direction, and the like of the wafer W are determined. Afterwards, the process is shifted to a block 107.

In the block 107, the alignment stage 32 of the relative moving means 30 are controllably moved in accordance with the moving length and direction of the wafer W. The determined dot-mark-forming position $(X_2, Z_2)$ is adjusted to the image-forming position of the machining processing unit 20 by the control driving unit 33 of the relative moving means 30 and the positioning operation is completed. Then, in a block 108, the focal point of the machining processing unit 20 is adjusted finely and automatically. In a block 109, desired laser marking is performed to the dot-mark-forming position.

In a block 110, the fine dot marks formed at the desired dot-mark-forming position are read, and the read information is subjected to image processing to check the visibility or the like of the mark. In blocks 111, 112, and 113, operations reverse to those in the blocks 100, 101, and 102 are conducted, and the processes for the arbitrary wafer W of the plurality of wafers W stored in the wafer carrier is completed.

A total time required for positioning is about one second: about 30 msec for image pickup, about 100 to 200 msec for calculation, and about one second for movement. This time is several tenths of a time required for determining a dot-mark-forming position in a conventional art. When setting conditions such as the size of the wafer peripheral surface, an image pickup area, the number of pixels of the CCD, image processing performance, and the accuracy of the moving mechanism are appropriately selected, positioning accuracy can be further improved.

Figure 8:
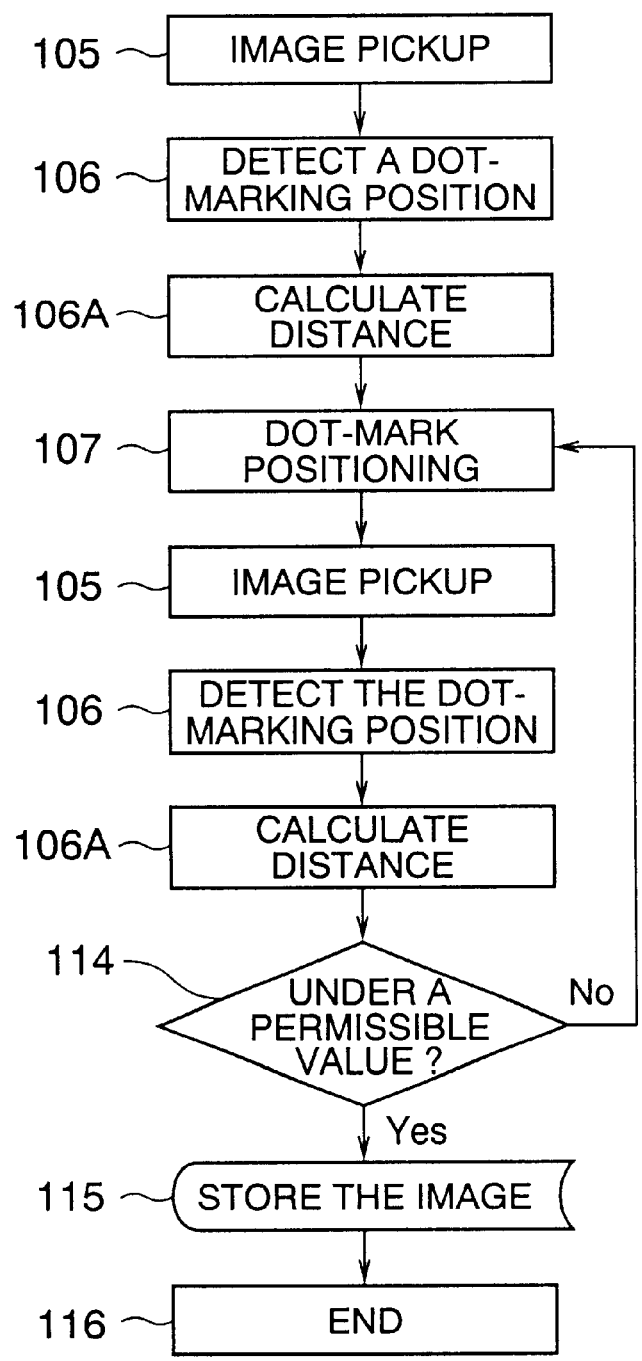
FIG. 8 is a flow chart showing another example of the control procedure of the positioning apparatus.

FIG. 8 shows another example of a procedure of the calculation unit 50 applied to the present invention. In the block 107, if the alignment stage 32 is moved by a command from the control unit 52, and a shift length between the dot-mark-forming position $(X_2, Z_2)$ on the image-pickup screen and the image-forming position $(X_3, Z_3)$ on the overlapping screen of the machining processing unit 20 exceeds a preset permissible value of about 10 μm, image pickup and detection of a marking position are conducted again, and the shift length is calculated again. When the shift length between the image-forming position $(X_3, Z_3)$ and the dot-mark-forming position $(X_2, Z_2)$ falls within a preset permissible range, the process shifts to a block 115. In the block 115, information related to the sectional shape, the marking position, and the like of the picked semiconductor wafer W is stored, and the processes end at a block 116.

When the above procedure is employed, the picked image information is valuable as model information and can be easily stored in the storage unit 120. Therefore, even though the wafer types are changed in multi-product, small-lot-sized production, detection can be immediately started by merely downloading data from the storage unit 120. Moreover, the information is effective as analysis data, determination data, and the like when marking defects occur. When abnormalities hindering normal marking operations occur, the information can be used as investigation materials for causal association of the abnormal phenomena. Accordingly, various maintenance steps can be easily performed, and stable marking can be always performed effectively.

Figure 9:
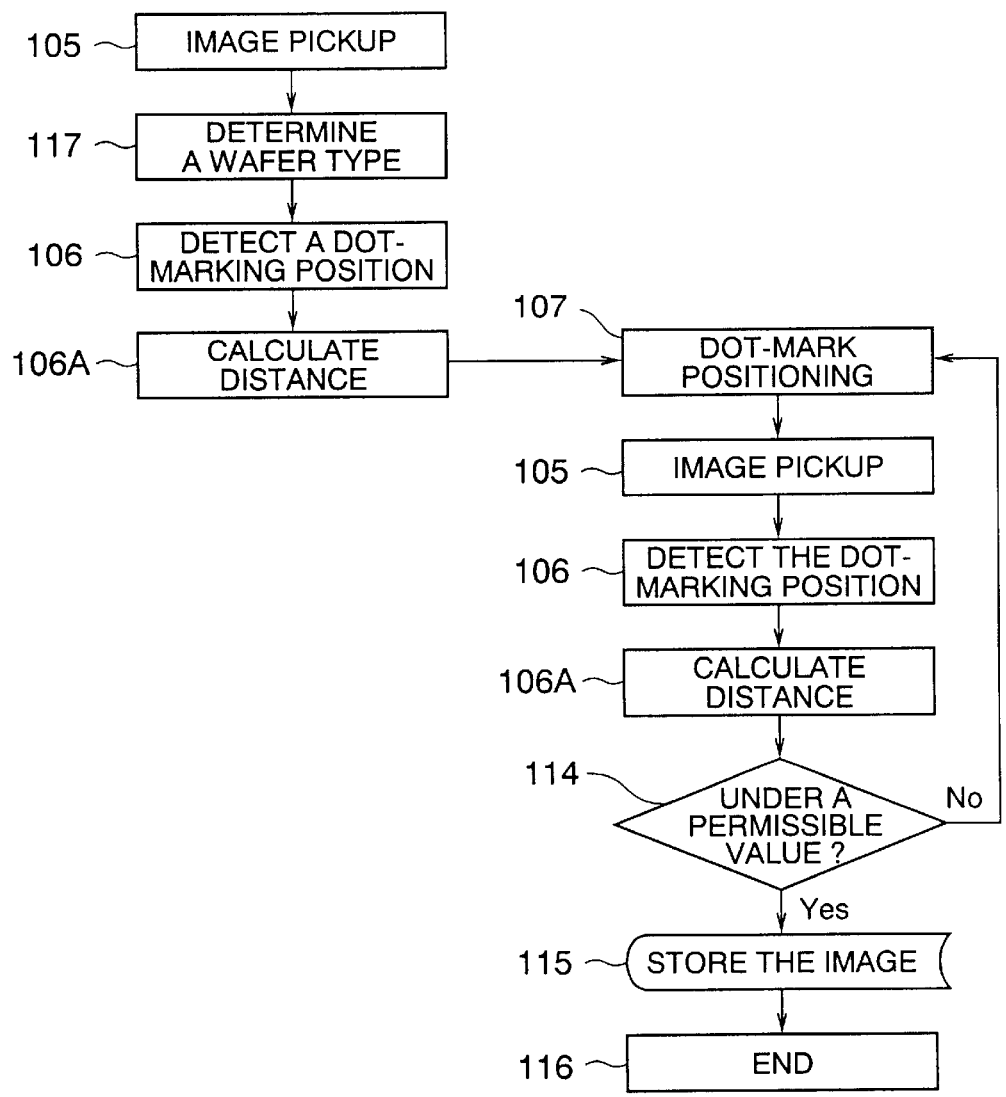
FIG. 9 is a flow chart showing still another example of the control procedure of the positioning apparatus.
Figure 10A:
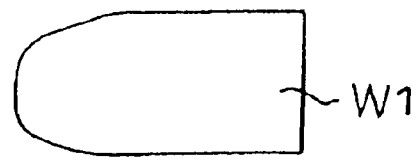
FIGS. 10A to 10D show various sectional shapes of wafers.
Figure 10B:
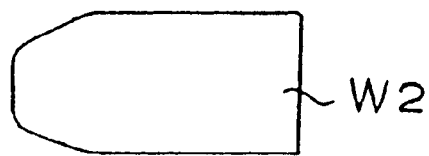
Figure 10C:
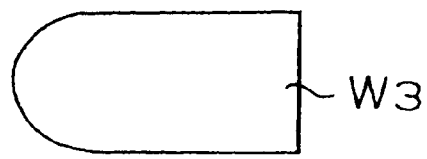
Figure 10D:
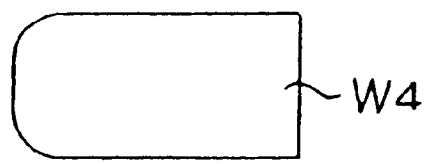

FIG. 9 shows an example of still another example of the procedure of the calculation unit 50. In this figure, the pre-stored sectional shapes of the wafers W1 to W4 with different sectional shapes as shown in FIG. 10A are compared to the picked sectional shape of the semiconductor wafer W to determine the type of the picked sectional shape. On the basis of a dot-mark-forming position preset, the dot-mark-forming position $(X_2, Z_2)$ on the image-pickup screen is calculated according to the determined dot-mark-forming position.

The processes start from the block 105. Then, in a block 117, the various sectional shapes of the wafers W1 to W4 which are pre-stored in the storage unit 120 as standard patterns are sequentially compared to the picked sectional shape of the wafer W, and their equality is determined. After the type of the picked wafer sectional shape is specified, the processes shift to blocks 106, 106A, 107, 114, and 115. In the block 115, information related to the sectional shape, the marking position, and the like of the picked wafer W is stored, and the processes end in the block 116.

For the wafers W1 to W4 as the standard patterns as shown in FIGS. 10A to 10D, all patterns of targeted sectional shapes can be stored in advance, and characteristic partial patterns can be also stored in advance. In addition, with respect to the sectional shapes of the wafers, only the sectional shapes of wafers of several types can be stored so as to be compared to picked sectional shapes of wafers. When a picked sectional shape of the wafer is inconsistent with any of the stored sectional shapes, it can be additionally stored as the sectional shape of a wafer of a new type. A dot-mark-forming position can also be designated by the operation unit 12 or be automatically set. There are methods as follows for automatically setting the dot-mark-forming position. For example, similar sectional shapes of wafers which are stored in advance are identified, and the same position on the picked sectional shape of the wafer as a dot-mark-forming position set in the similar sectional shapes of the wafers is automatically calculated. Or, a position satisfying predetermined conditions such as distance from a wafer center or from the end face of a wafer rim is automatically calculated.

In the wafers W with different sectional shapes as shown in FIG. 10, when dot-mark-forming positions are positioned in predetermined marking areas, the positioning operation is easily performed if degrees of similarity are determined by superposing information on the various wafers and information on wafers W1 to W4, which are pre-stored abundantly. In this way, an actual operation time rate required for a mechanical positioning operation can be considerably reduced, semiconductor devices can be efficiently manufactured in multi-product, small-lot-sized production, and automatization of semiconductor manufacturing steps can be effectively achieved. In addition, the blocks 105 to 116 shown in FIGS. 8 and 9 as examples of the control means can be used in place of the blocks 105 to 107 shown in FIG. 7 as an example of the control means.

In this embodiment, a pickup image is displayed on the image display device 11 to perform calculation of the marking position or the like. Yet, such a performance becomes needless and the image display device 11 may become unnecessary if the processes are performed inside the control unit 52. Thus, in such a case, contents related to image display in the above description can be omitted. Yet, when the image is not displayed, visual check cannot be performed.

As apparent from the above description, in the method and apparatus for determining a dot-mark-forming position of a semiconductor wafer W according to this embodiment, even though special hardware and software techniques are not used, the fine peripheral surface of the wafer W can be picked as a sectional image by the image-pickup means 40. In addition, rapid transmission and machining can be realized for positional information related to a desired dot-mark-forming position which is a part of the sectional image. Consequently, the relative moving means 30 can be operated at high speed and accuracy with respect to the processing axial line, or laser optical axis, of the machining processing unit 20. Thus, a dot-mark-forming position not only in a circumferential direction but also a minute area in the radial direction of the peripheral surface of the semiconductor wafer W can be detected and specified. Accordingly, a desired marking on the specified position can be stably performed.

The present invention is not limited to the above embodiment only, and, as a matter of course, includes a technical scope which a person skilled in the art can modify based on the embodiment.

What is claimed is:

1. An image pick-up apparatus for picking up an image of a peripheral surface of a semiconductor wafer, image-pick-up apparatus comprising:

an alignment stage adapted to support the semiconductor wafer; and an image-pickup means including an illumination device and an image-pickup device operable to pick up the image of the peripheral surface of the semiconductor wafer, wherein the illumination device and the image-pickup device are disposed so as to be opposed to each other interposing the semiconductor wafer in such a manner that: (a) an optical axis of illumination light from the illumination device to the image-pickup device runs in parallel with a tangent line to the peripheral surface of the semiconductor wafer; and (b) a part of the illumination light irradiates a part of the peripheral surface of the semiconductor wafer.

2. A calculating apparatus for calculating a shape of a peripheral surface of a semiconductor wafer, the calculating apparatus comprising:

an image-pickup apparatus for picking up an image of the peripheral surface of the semiconductor wafer, the image-pickup apparatus including an alignment stage adapted to support the semiconductor wafer and an image-pickup means which includes an illumination device and an image-pickup device, the image-pickup means operable to pickup the image of the peripheral surface of the semiconductor wafer, wherein the illumination device and the image-pickup device are disposed so as to be opposed to each other interposing the semiconductor wafer in such a manner that: (a) an optical axis of illumination light from the illumination device to the image-pickup device runs in parallel with a tangent line to the peripheral surface of the semiconductor wafer; and (b) a part of the illumination light irradiates a part of the peripheral surface of the semiconductor wafer; and a calculation means for calculating the shape of the peripheral surface of the semiconductor wafer based on image data of at least a side surface of the part of the peripheral surface of the semiconductor wafer, the image of which is picked up by the image-pickup apparatus.

* * * * *